(12) United States Patent
Kikuchi et al.

(10) Patent No.: US 6,231,290 B1
(45) Date of Patent: May 15, 2001

(54) PROCESSING METHOD AND PROCESSING UNIT FOR SUBSTRATE

(75) Inventors: Hisashi Kikuchi, Esashi; Katsumi Ishii, Tsukui-gun, both of (JP)

(73) Assignee: Tokyo Electron, Tokyo-To (JP)

( * ) Notice: Subject to any disclaimer, the term of this patent is extended or adjusted under 35 U.S.C. 154(b) by 0 days.

(21) Appl. No.: 09/271,341

(22) Filed: Mar. 18, 1999

(30) Foreign Application Priority Data

Mar. 23, 1998 (JP) .................................................. 10-094006

(51) Int. Cl.[7] .................................................. B65G 49/07
(52) U.S. Cl. .................. 414/221; 414/805; 414/935; 414/938; 414/411
(58) Field of Search ................................. 414/411, 217, 414/935, 939, 940, 938, 331, 805, 221

(56) References Cited

U.S. PATENT DOCUMENTS

| | | | |
|---|---|---|---|
| 5,433,574 | * 7/1995 | Kawano et al. | 414/217 |
| 5,472,086 | * 12/1995 | Holliday et al. | 414/217 |
| 5,476,176 | * 12/1995 | Gregerson et al. | 414/217 |
| 5,562,383 | * 10/1996 | Iwai et al. | 414/217 |
| 5,575,081 | * 11/1996 | Ludwig | 414/217 |
| 5,607,276 | * 3/1997 | Muka et al. | 414/331 |
| 5,697,749 | * 12/1997 | Iwabuchi et al. | 414/217 |
| 5,810,537 | * 9/1998 | Briner et al. | 414/217 |
| 5,971,696 | * 10/1999 | Endo et al. | 414/217 |

FOREIGN PATENT DOCUMENTS 10321698    12/1998    (JP) .

OTHER PUBLICATIONS

English Translation (Abstract Only) of Japanese Publication No. 10321698, Published Dec. 4, 1998.

* cited by examiner

*Primary Examiner*—Joseph A. Fischetti
(74) *Attorney, Agent, or Firm*—Smith, Gambrell & Russell, LLP

(57) ABSTRACT

A processing unit for a substrate comprises a partition 6 provided between an atmospheric area S1 and an inert gas area S2. The partition 6 has an opening 22 to communicate the atmospheric area S1 and the inert gas area S2. A door 23 is provided at the opening 22 to open and close it. Carrier holding device 11 is provided for holding a carrier 2 of the substrate in such a manner that the carrier 2 comes in contact with the opening 22 on the side of the atmospheric area. Inert gas replacing device 56 is provided for replacing a gas in the carrier 2 with an inert gas by introducing the inert gas into the carrier 2 when the door 23 closes the opening 22 and the carrier 2 comes in contact with the opening 22 on the side of the atmospheric area by the carrier holding device 11. This processing unit can perform the process of the substrate without increasing the concentration of the oxygen in the inert gas area S2 by preventing leakage of the air from the atmospheric area S1 into the inert gas area S2.

11 Claims, 7 Drawing Sheets

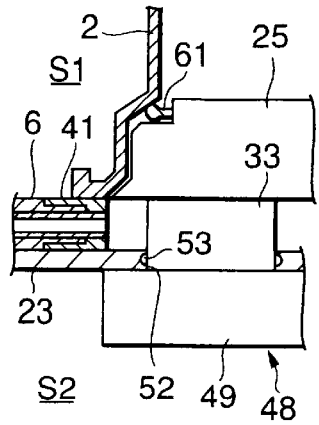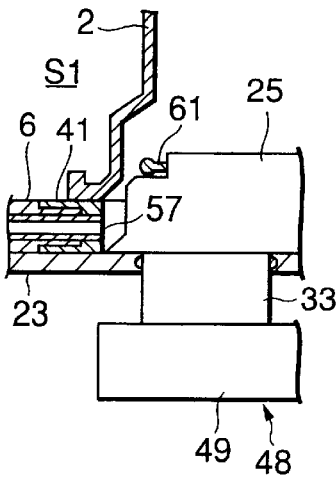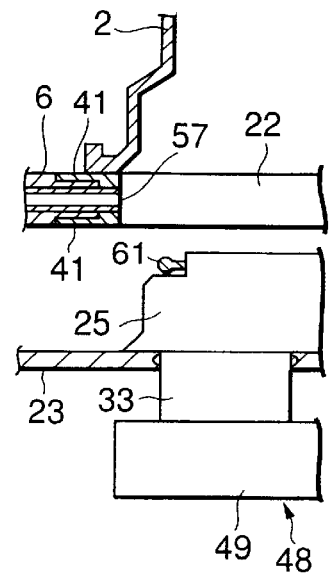
FIG.7a
FIG.7b
FIG.7c
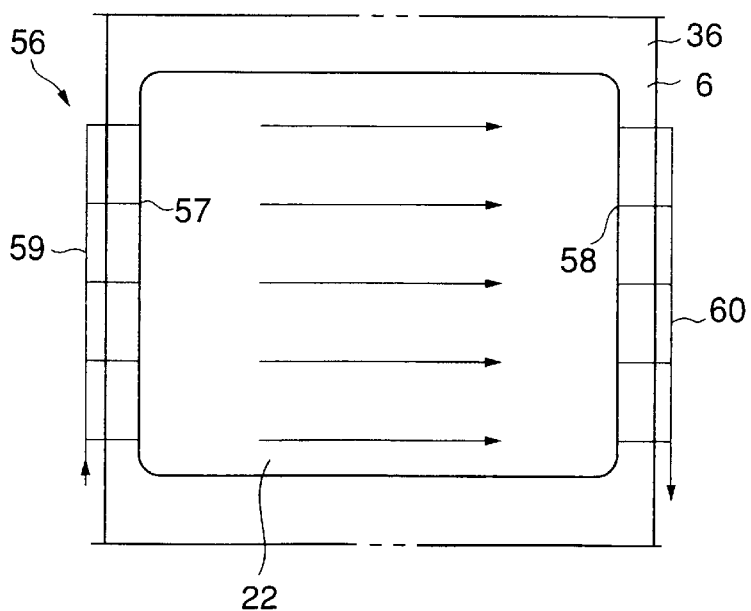
FIG.8

PROCESSING METHOD AND PROCESSING UNIT FOR SUBSTRATE

BACKGROUND OF THE INVENTION

1. Field of the Invention

This invention relates to a processing method for a substrate and a processing unit for a substrate.

2. Disclosure of the Prior Art

Processes for manufacturing semiconductor devices include steps in which semiconductors as substrates undergo processes such as oxidation, diffusion, CVD (Chemical Vapor Deposition) or the like. Thermal processing units are often used for conducting the various processes. A conventional thermal processing unit comprises: an operation area where an operator or an automatic conveying robot holds and conveys a carrier housing semiconductor wafers, and a loading area where semiconductor wafers in the carrier are transferred to a wafer-boat as a holder of substrates which is then loaded into or unloaded from a thermal processing furnace.

In such thermal processing units, it is preferable for a partition (bulkhead) to be provided between the operation area which is exposed to the atmosphere and the loading area. The partition allows the loading area to remain cleaner than the operation area and prevents a natural oxidation film from forming on the semiconductor wafers. The loading area should also be preferably filled with an inert gas such as nitrogen. A closed-type carrier, whose entrance for semiconductor wafers can be hermetically closed by a lid, should also be preferably used in the thermal processing unit in order to prevent the semiconductor wafers from being contaminated with particles.

An opening is provided in the partition between the operation area and the loading area. A door is provided at the opening to open and close it. When processing the semiconductor wafers, the lid of the carrier is aligned to be in contact with the opening, and the door and the lid are opened to communicate the interior of the carrier with the loading area. The semiconductor wafers are then conveyed from the interior of the carrier to the wafer-boat in the loading area via the opening. The wafer-boat is then loaded in the thermal processing furnace to perform the prescribed processes on the semiconductor wafers. The way of opening the door and the lid together is described in Japanese Patent Laid-Open No. 8-279546.

The interior of the carrier is full of the atmospheric air unless it is filled with another gas such as an inert gas. Because of this, the air in the carrier may flow into the loading area when the carrier is aligned with the opening and the door and the lid are opened. The concentration of the oxygen in the loading area increases if the air in the carrier flows into the loading area. This makes the replacement of the atmospheric air with an inert gas more time-consuming and increases the possibility of oxidation film forming on the semiconductor wafers. This may have a bad effect on processing.

SUMMARY OF THE INVENTION

Therefore, the object of this invention is to provide a processing unit and method for a substrate, which can perform the process of the substrate without increasing the concentration of the oxygen in the loading area by preventing the leakage of the air from the operation area into the loading area.

To achieve the above objects, this invention is characterized by a feature whrein a processing unit for a substrate comprises: a partition provided between an atmospheric area and an inert gas area, and having an opening to communicate the atmospheric area with the inert gas area, an door provided above the opening to open and close it, carrier holding means for holding a carrier of the substrate in such a manner that the carrier comes in contact with the opening on the side of the atmospheric area, and inert gas replacing means for replacing a gas in the carrier with an inert gas by introducing the inert gas into the carrier when the door closes the opening and the carrier comes in contact with the opening on the side of the atmospheric area by the carrier holding means.

In addition, to achieve the above objects, this invention is characterized by a feature wherein a processing method for a substrate by using a processing unit for the substrate comprising: a partition provided between an atmospheric area and an inert gas area, and having an opening to communicate the atmospheric area with the inert gas area, an door provided above the opening to open and close it, carrier holding means for holding a carrier of the substrate in such a manner that the carrier comes in contact with the opening on the side of the atmospheric area, and inert gas replacing means for replacing a gas in the carrier with an inert gas by introducing the inert gas into the carrier when the door closes the opening and the carrier comes in contact with the opening on the side of the atmospheric area by the carrier holding means, comprises; a step of closing the opening by the door, a step of holding the carrier including the substrate by the carrier holding means in such a manner that the carrier comes in contact with the opening on the side of the atmospheric area, a step of replacing the gas in the carrier with the inert gas by the inert gas replacing means, and a step of opening the door to communicate the interior of the carrier replaced with the inert gas with the inert gas area via the opening.

According to these features, the process of the substrate can be performed without increasing the concentration of the oxygen in the loading area by preventing the leakage of the air from the operation area into the loading area.

Preferably, the carrier may have an opening part to communicate with the opening when the carrier comes in contact with the opening on the side of the atmospheric area, and the inert gas replacing means may have an inert gas supplying hole and a gas exhausting hole which are openly provided in the opening.

Preferably, the carrier may have a lid to open and close the opening part of the carrier.

Preferably, a lid opening-closing mechanism may be mounted on the door for holding the lid of the carrier and for opening and closing it.

Preferably, a door opening-closing mechanism may be mounted on the partition for opening and closing the door, and the door opening-closing mechanism may be adapted to open the door in a state where the lid opening-closing mechanism holds the lid of the carrier.

Preferably, the carrier holding means may have carrier positioning means for positioning the carrier in such a manner that the carrier comes in sealing contact with the opening on the side of the atmospheric area.

Preferably, the carrier and the opening in the partition may be adapted to come in sealing contact with each other via a sealing element.

Preferably, the partition may have a second opening to communicate the atmospheric area with the inert gas area, and the unit further may comprise: a second door provided above the second opening to open and close it, second carrier holding means for holding a carrier of the substrate in such a manner that the carrier comes in contact with the second opening on the side of the atmospheric area, and second inert gas replacing means for replacing a gas in the carrier with an inert gas by introducing the inert gas into the carrier when the second door closes the second opening and the carrier comes in contact with the second opening on the side of the atmospheric area by the second carrier holding means.

Preferably, the door may be adapted to move downward to open the opening, and the second door is adapted to move upward to open the second opening.

BRIEF DESCRIPTION OF THE DRAWINGS

FIGS. 7a to 7c are explanatory views showing a way for opening and closing the lid and the door of the vertical thermal processing unit in FIG. 1;

FIG. 8 is a front view of an example of the inert gas replacing means;

DESCRIPTION OF THE PREFERRED EMBODIMENT

Figure 1:
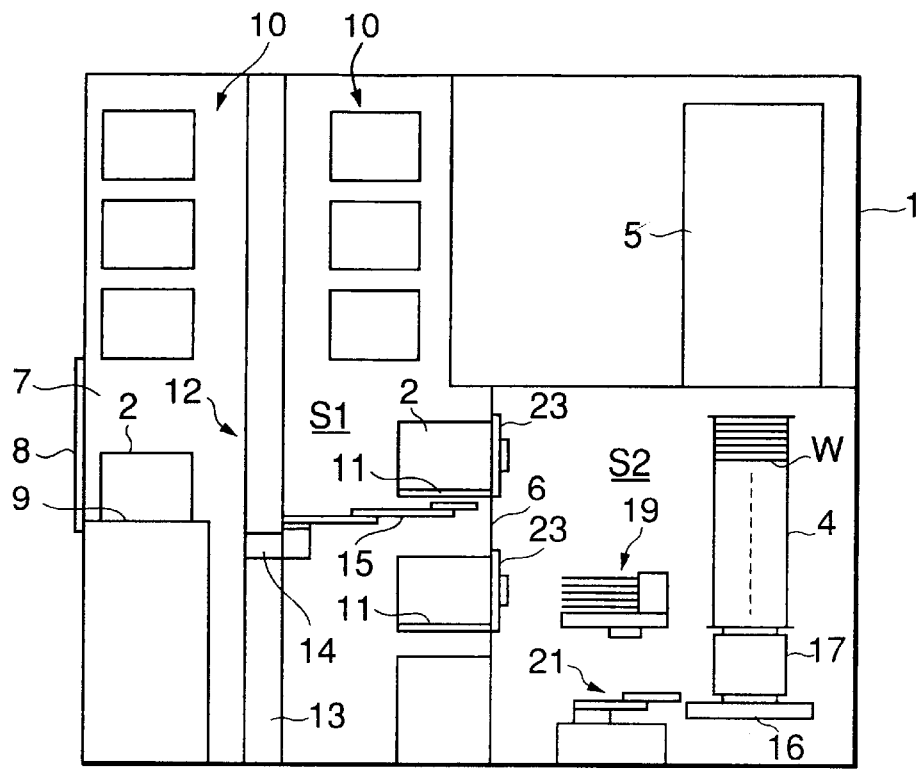
FIG. 1 is a schematic vertical sectional view of an embodiment of the vertical thermal processing unit according to the invention.
Figures 2A, 2B:
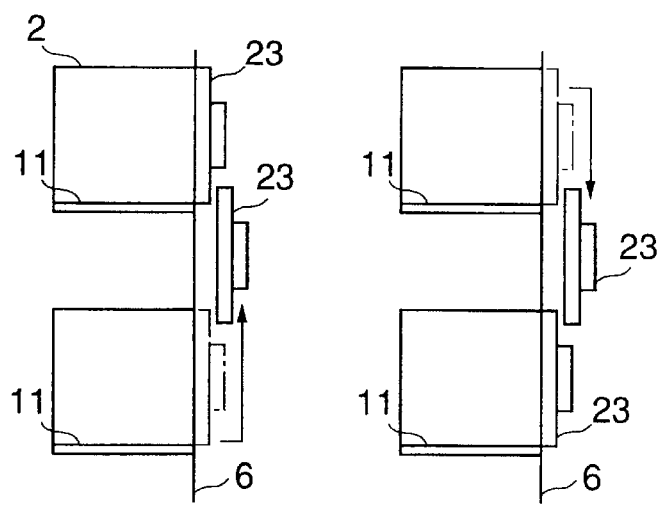
FIGS. 2a and 2b are explanatory views showing a way for opening and retracting a door closing an opening in a partition of the vertical thremal processing unit in FIG. 1.
Figure 3:
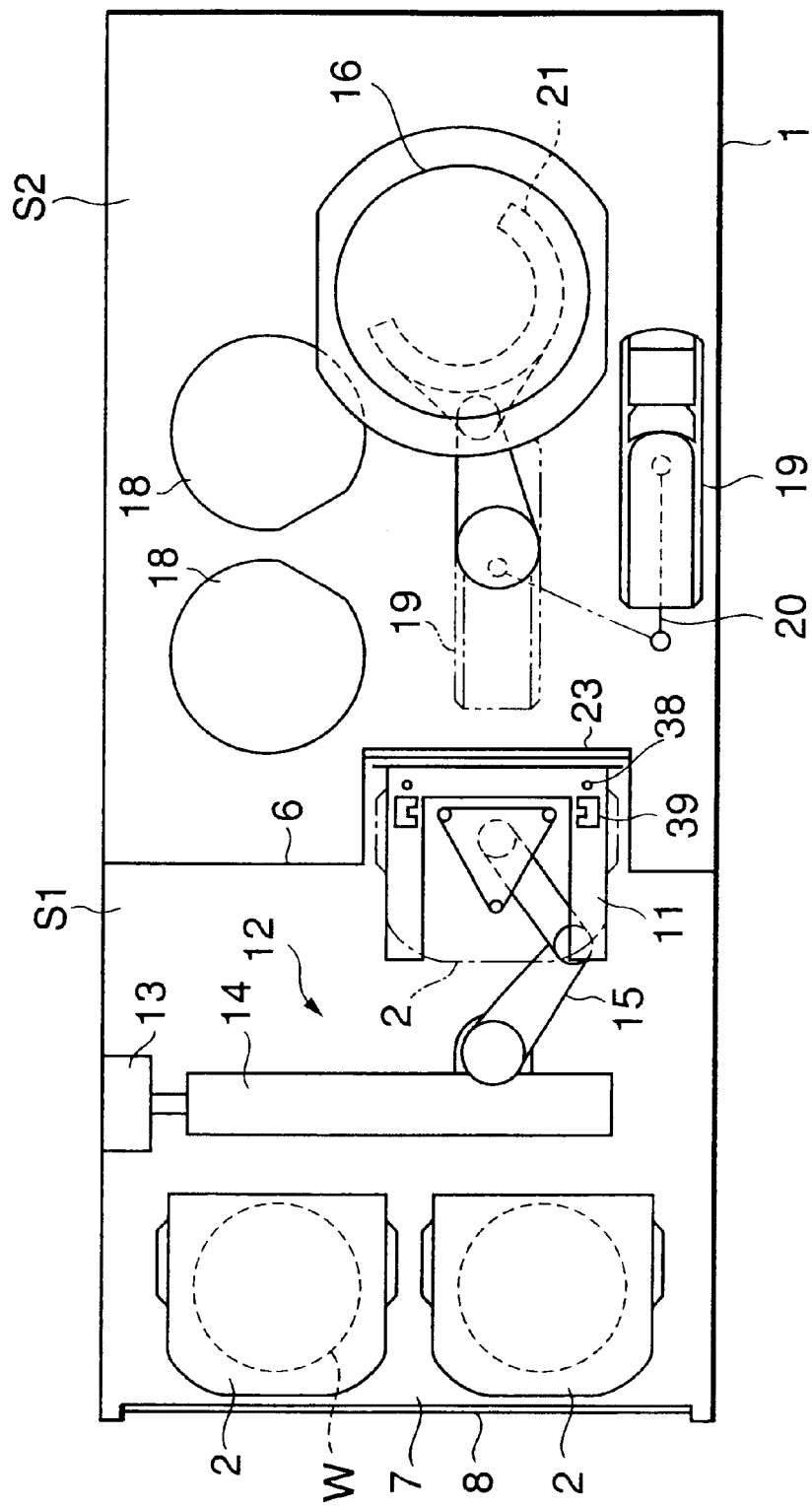
FIG. 3 is a schematic plan view of the vertical thermral processing unit in FIG. 1.

Embodiments of the invention will now be described in more detail with reference to FIGS. 1 to 11. FIG. 1 schematically shows a vertical section of an embodiment of the vertical thermal processing unit according to the invention. FIGS. 2a and 2b explain a way of opening and retracting a door closing an opening in a partition of the vertical thermal processing unit in FIG. 1. FIG. 3 is a schematic plan view of the vertical thermal processing unit in FIG. 1.

In these figures, a numeral sign 1 designates a housing forming outside walls of the vertical thermal processing unit disposed in a clean room. The interior of the housing 1 is divided by a partition (bulkhead) 6 into an operation area S1 into and from which carriers 2 are conveyed and in which the carries 5 are kept, and a loading area S2 where semiconductor wafers W (substrates to be processed) in the carriers 2 are transferred to wafer-boats 4 which are loaded into or unloaded from a vertical type thermal processing furnace 5.

An entrance 7 is provided in front of the housing 1 for introducing and discharging the carriers 2 by an operator or an automatic conveying robot. The entrance 7 is provided with a door 8 which can move vertically to open and close the entrance 7. A stage 9 is provided in the operation area S1 for placing the carrier 2 thereon. Shelf-like storing sections 10 are formed above the stage 9 and near the upper portion of the partition 6 for storing a plurality of the carriers 2.

Two stages (carrier stages) 11 are provided in vertically spaced positions on the side of the partition 6 as tables for placing the carriers 2 thereon. A carrier transferring mechanism 12 is arranged in the operation area S1 for transferring the carriers 2 to and from the stage 9, the storing sections 10 and the stages 11. The carrier transferring mechanism 12 comprises: an elevating arm 14 which can be moved vertically by an elevating mechanism 13 provided on a side of the operation area S1, and a transferring arm 15 mounted on the elevating arm 14 for supporting the bottom of the carrier 2 to horizontally transfer the carrier 2.

The thermal processing furnace 5 is disposed in a rear and upper portion in the loading area S2. The thermal processing furnace 5 has a furnace opening in the bottom thereof A lid 16 is provided below the furnace 5. The lid 16 is adapted to be vertically moved by an elevating mechanism (not shown) for loading a wafer-boat 4 into and unloading it from the furnace 5 and for opening and closing the furnace opening. The wafer-boat 4, which can hold a large number of semiconductor wafers W in vertical equally spaced multistairs, is adapted to be placed on a thermal pedestal 17 on the lid 16. The thermal processing furnace 5 has a shutter (not shown) for closing the furnace opening after the lid 16 is moved downward to unload the wafer-boat 4.

As shown in FIG. 3, two boat-placing portions 18 are disposed adjacently in a side region of the loading area S2 for placing the wafer-boat 4 thereon when transferring semiconductor wafers W into and from the wafer-boat 4. A moving mechanism 19 is arranged in the loading area S2 for transferring semiconductor wafers W between the wafer-boat 4 on any one of the boat-placing portions 18 and the carrier 2. The moving mechanism 19 can be moved by an arm 20 from a waiting position shown in solid lines in FIG. 3 to an operating position shown in imaginary lines in the same figure. A boat-conveying mechanism 21 is arranged for conveying the wafer-boat 4 between the lid 16 and the boat-placing portions 18.

Figure 4:
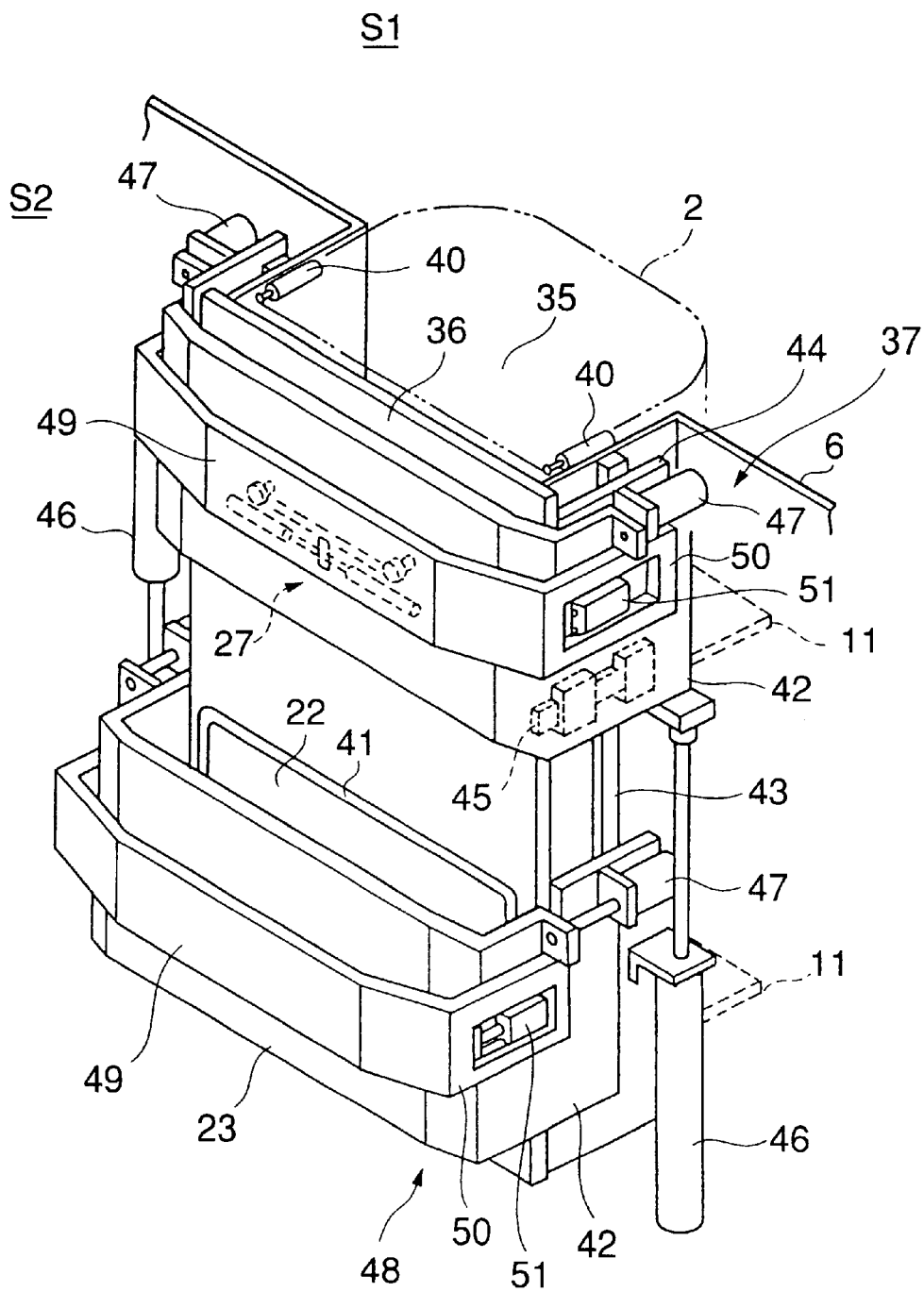
FIG. 4 is a schematic perspective view of the door and a lid opening-closing mechanism of the vertical thermal processing unit in FIG. 1.
Figure 5:
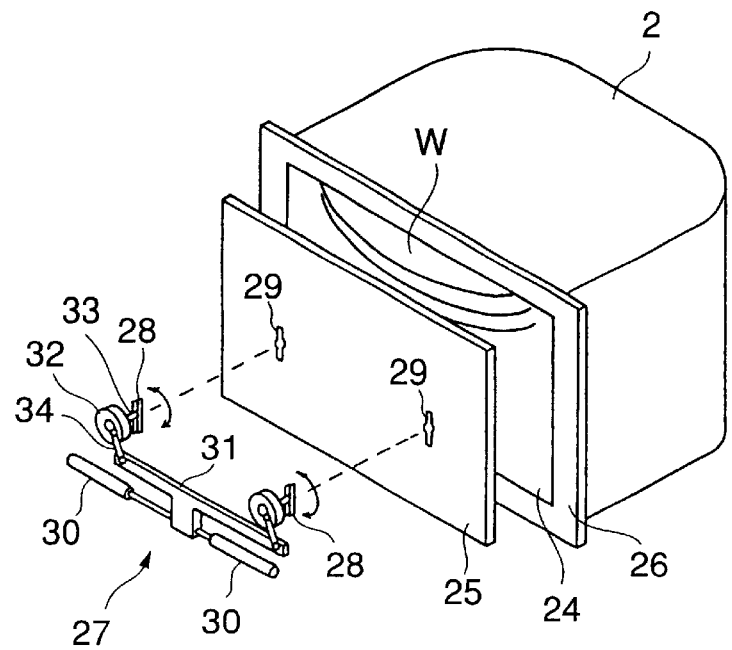
FIG. 5 is a schematic perspective view of the carrier and the key operating mechanism of the vertical thermal processing unit in FIG. 1.

A clean atmospheric air, which is passed through filters (not shown), is supplied into the operation area S1, so that the operation area S1 is filled with the clean atmospheric air. On the other hand, an inert gas such as nitrogen ($N_2$) is supplied into the loading area S2, so that the loading area S2 is filled with the inert gas. As shown in FIG. 4, the partition 6 separating the loading area S2 from the operation area S1 has two, upper and lower openings 22, with each of which the carrier 2 is adapted to come into contact on the side of the operation area S1. As shown in FIG. 5, each opening 22 is provided with a lid 25 for opening and closing the opening 22. The opening 22 is formed in such a manner that the size of the opening 22 is the same as that of a wafer-entrance 24 of the carrier 2, so that semiconductor wafers W can be transferred into and from the carrier 2 through the opening 22 and the wafer-entrance 24.

The structure of the carrier 2 and the opening and closing function of the lid 25 of the carrier 2 will be described in more detail below.

As shown in FIG. 5, the carrier 2 is a so-called closed type, which can house a number of, for example 13 or 25 semiconductor wafers W and which can be hermetically closed by the lid 25. The carrier 2 comprises a container for housing and holding semiconductor wafers W in multistairs in horizontal attitude and in vertically spaced relation by a prescribed pitch. The diameter of the semiconductor wafer W is for example 30 mm. The lid 25 is removably attached at the wafer-entrance 24 formed in front of the carrier 2 in such a manner that the lid 25 can sealingly close the wafer-entrance 24. The carrier 2 and the lid 25 are made of, for example, a synthetic resin. A flange 26 is formed along the sides of the wafer-entrance 24.

As shown in FIG. 5, the lid 25 of the carrier 2 has one or more, for example two, key holes 29. Lock-pins (not shown) are arranged to stick out of the upper edge and the lower edge of the lid 25 when each key 28 of a key handling mechanism 27 is inserted into each key hole 29 and is rotated in a direction. Then the lock-pins can fit in recesses (not shown) formed at the upper edge and the lower edge of the wafer-entrance 24 of the carrier 2 and can lock the lid 25 in a closing position. The lock-pins (not shown) are also adapted to be withdrawn to the upper edge and the lower edge of the lid 25 when each key 28 of the key handling mechanism 27 is inserted into each key hole 29 and is rotated in the opposite direction. Then, the lock-pins can leave the recesses formed at the upper edge and the lower edge of the wafer-entrance 24 of the carrier 2 and can release the lid 25 from the closing position. Normally, the lid 25 is locked in the closing position. The lid 25 is also adapted to be held by the keys 28 when the lid 25 is released from the closing position by inserting the keys 28 into the key holes 29 and by rotating the keys 28.

As FIG. 5 shows, the key handling mechanism 27 comprises: a handling member 31 which can be shifted in a lateral direction by right and left air cylinders 30 as driving means, rotating members 32 each of which has a rotating shaft 33 and can be rotated by the handling member 31 around the shaft 33, and the keys 28 attached to the tips of the rotating shafts 33 of the rotating members 32. The handling member 31 and the rotating members 32 are so connected by links 34 that linear lateral movement of the handling member 31 can be converted into a rotating movement of the rotating members 32. Alternatively, they may be linked by a gear mechanism. The lock-pins (not shown) are adapted to be withdrawn to release the lid 25 from the closing position and the lid 25 is held by the keys 28 when each key 28 is inserted into each key hole 29 of the lid 25 and is rotated. As shown in FIG. 4, the key handling mechanism 27 is mounted at a front-rear moving frame 49.

Then the structures of the openings 22 and doors 23 for the openings 22 are described in more detail as follows.

As shown in FIG. 4, the partition 6 is formed to have a vertical groove. A part of the groove forms a recess 35 for accommodating the front portion of the carrier 2. The bottom of the recess 35 is formed as an abutting wall 36. The outside of the bottom of the recess 35 abuts the doors 23. Both of the two, upper and lower openings 22 are formed in the abutting wall 36. The two, upper and lower stages 11 are arranged in the recess 35 for placing the two carriers 2, respectively, so that the two carriers 2 abut the abutting wall 36, respectively.

Figure 6:
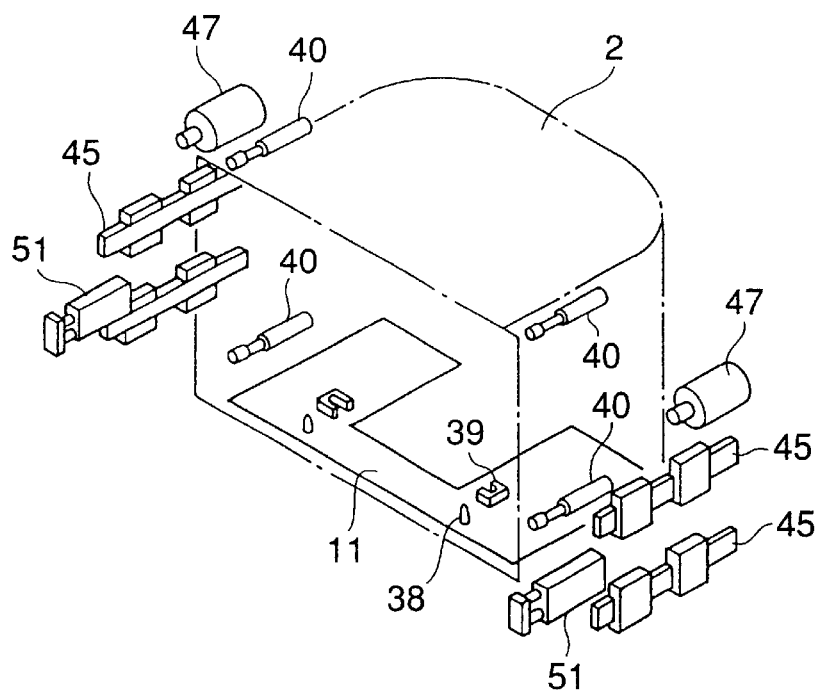
FIG. 6 is a schematic perspective view of various mechanisms provided adjacent to the carrier stage of the vertical thermal processing unit in FIG. 1.

As shown in FIGS. 3 and 6, each stage 11 has a U-shape in plan view, which opens to the side of the operation area S1, in order to prevent interference with the transferring arm 15 of the carrier transferring mechanism 12. Positioning pins 38 protrude from the upper surface of each stage 11 for fitting in holes (not shown) on the bottom of the carrier 2.

Carrier sensors 39 are arranged on the upper surface of each stage 11 for detecting whether the carrier 2 is on the stage 11.

As shown in FIG. 4, carrier fixing air cylinders 40 are arranged on both sides of the recess 35 as carrier fixing means in order to press and fix (lock) the front portion of the carrier 2 to a surrounding portion of the opening 22 via the rear surface of the flange 26 of the carrier 2 (see FIG. 5). The stage 11 is supported movably in a front-rear direction in order to follow the carrier 2 which can be moved by the carrier fixing air cylinders 40. Sealing elements 41 are attached along the surrounding portion of each opening 22 in order to provide hermetical seal between the carrier 2 and the opening 22 and between the mated door 23 and the opening 22 (see FIGS. 7a–7c).

As shown in FIG. 4, each door 23 is adapted to be moved into the side of the loading area S2 and in vertical direction by a door opening-closing mechanism 37, so that the door 23 can be opened. The door 23 facing the carrier 2 on one of the two stages 11 is opened for allowing access to the semiconductor wafers W in the carrier 2. The other door 23 for the other of the two stages 11 remains closed. In more detail, as shown in FIGS. 2a and 2b, the door 23 for the upper stage 11 remains closed when the door 23 for the lower stage 11 is opened and retracted upward. To the contrary, the door 23 for the lower stage 11 remains closed when the door 23 for the upper stage 11 is opened and retracted downward.

As shown in FIG. 4, each door 23 has two supporting arms 42 extended for facing both outer sides of the recess 35 of the partition 6. The door opening-closing mechanism 37, which can operate to open and close the door 23 as mentioned above, has two vertically movable frames 44 supported for vertical movement by two vertical guides 43 on both outer sides of the recess 35 of the partition 6. Each vertically movable frame 44 is connected with a door-elevating air cylinder 46 which can move the frame 44 up and down. The supporting arms 42 of the door 23 are supported movably in a front-rear direction on the vertically movable frames 44 via front-rear guides 45. Door opening-closing air cylinders 47 are mounted on the vertically movable frames 44 for moving the door 23 in the front-rear direction via the supporting arms 42 to open and close the door 23. In the embodiment shown in FIG. 4, one (right) door-elevating air cylinder 46 is adapted to move the upper door 23 up and down, and the other (left) door-elevating air cylinder 46 is adapted to move the lower door 23 up and down.

A lid opening-closing mechanism 48 is mounted at each door 23 for opening and closing the corresponding lid 25 of the carrier 2 independently of the door 23. The lid opening-closing mechanism 48 has a front-rear movable frame 49 arranged movably in a front-rear direction in front of the door 23. The key handling mechanism 27 is incorporated in the front-rear movable frame 49. In FIG. 4, the front-rear movable frame 49 has two supporting arms 50 extended for facing both supporting arms 42 of the door 23. The supporting arms 50 are supported movably in a front-rear direction on both supporting arms 42 via lid opening-closing air cylinders with guides 51. The partition 6 is also formed in such a manner that the thickness of the partition 6 can secure enough space to accommodate the lid 25 in the opening 22 when the lid 25 is moved forward from the front of the carrier 2 by the lid opening-closing mechanism 48 and is opened.

As shown in FIGS. 7a–7c, bores 52 are formed in each door 23. The rotating shafts 33 of the key handling mechanism 27 incorporated in the front-rear movable frame 49 of the lid opening-closing mechanism 48 pass through the bores 52 slidably in a front-rear direction and rotatably with respect to the door 23.

Figure 9:
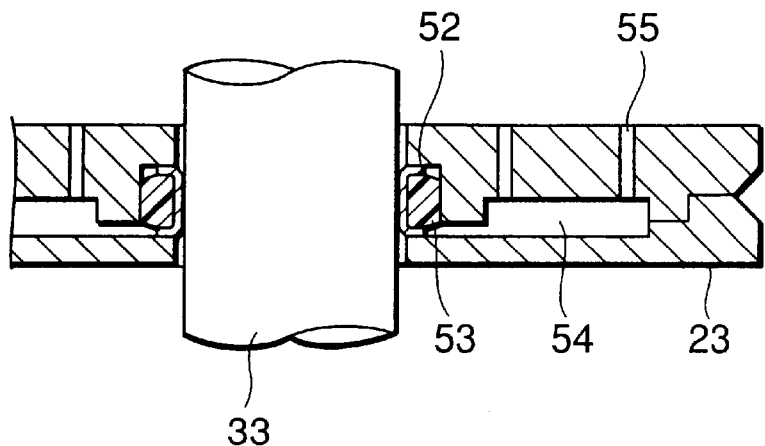
FIG. 9 is an enlarged partial sectional view of an example of the sealing means of the rotating shaft passing through the door.

As shown in FIG. 9, a sealing element 53 such as an O-ring is attached to the inside of each bore 52 as means for sealing between the rotating shaft 33 and the bore 52. Exhaust grooves 54 and exhaust bores 55 are formed in each door 23 for exhausting any gas around the bores 52 and the keys 28 to evacuate the area in cooperation with a vacuum pump (not shown). This ensures prevention of leakage of the air in the operation area S1 into the loading area S2 through a space between the bores 52 and the rotating shafts 33. This also serves as measures against particles around the keys 28.

FIG. 8 shows an inert gas replacing means 56 provided in each opening 22 for replacing a gas in the corresponding carrier 2 with an inert gas by introducing the inert gas into the carrier 2 when the corresponding door 23 closes the opening 22 and the lid 25 is opened by the lid opening-closing mechanism 48. As shown in FIGS. 7 and 8, the inert gas replacing means 56 comprises inert gas supplying holes 57 and gas exhausting holes 58 which are formed in inside edges of the opening 22. The inert gas may be nitrogen ($N_2$). As shown in FIG. 8, the inert gas supplying holes 57 are formed preferably in one of right and left sides of the opening 22 at a desirable interval, and the gas exhausting holes 58 are formed preferably in the other of right and left sides of the opening 22 at the same interval, so that the inert gas can flow in a direction parallel with the surface of the semiconductor wafers W housed in the carrier 2. This ensures that the interior of the carrier 2 and the interior of the opening 22 can be very smoothly replaced with the inert gas.

The inert gas supplying holes 57 are connected with an inert gas supplying source via inert gas supplying tubes. The exhausting holes 58 are connected with an exhausting system via exhausting tubes 60. A sensor for detecting oxygen density (not shown) is mounted in the exhausting tubes 60. The operation of the inert gas replacement is finished when the oxygen density sensor detects a density value less than a prescribed density value. Then the door 23 is opened and retracted. The lid 25 is opened and retracted together with the door 23 when the door 23 is opened and retracted. The operation of opening and closing of the lid 25, the operation of the inert gas replacement, the operation of opening and closing of the door 23 and so on are controlled by a control unit (not shown) in accordance with a prescribed program. The numeral sign 61 in the FIGS. 7a to 7c designates a sealing element for sealing between the carrier 2 and the lid 25.

The operation of the processing unit in the embodiment and the processing method using the processing unit will be described hereafter. First, a carrier 2 is transferred and placed on one stage 11 by the carrier transferring mechanism 12. If the carrier sensors 39 detect that the carrier 2 is placed on the stage 11, the carrier fixing air cylinders 40 are driven to press the carrier 2 so that the carrier 2 is sealingly fixed to the opening 22 in the partition 6. At that time, the opening 22 is closed by the door 23 and the keys 28 are withdrawn to the opening 22 for preventing the interference with the carrier 2.

Then, as shown in FIG. 7a, the inert gas replacing means 56 remove the air of the space between the door 23 and the lid 25 and supply the inert gas into the same space, in the state where the door 23 is sealingly closed and the lid 25 is closed.

Then, the lid 25 of the carrier 2 is opened and the inert gas replacing means 56 replace the interior of the carrier 2 with the inert gas while the door 23 remain closed. In more details, as shown in FIG. 7a, the lid opening-closing mechanism 48 operates as follows.

The keys 28 are moved forward to the lid 25 of the carrier 2 by the front-rear movable frame 49 until the keys 28 are inserted into the key holes 29 of the lid 25. The keys 28 are then rotated in the direction to release the lock of the lid 25. As shown in FIG. 7b, the keys 28 are moved rearward together with the lid 25 until the lid 25 abuts on the door 23 in the opening 22.

Then, the original gas in the carrier 2 is exhausted via the exhausting holes 58, and the inert gas such as nitrogen ($N_2$) is supplied into the carrier 2 via the inert gas supplying holes 57. In more details, the inert gas is supplied from the supplying holes 57 on one side of the opening 22 into the carrier 2 through the gap between the carrier 2 and the lid 25, and the gas such as remaining air in the carrier 2 and the opening 22 is exhausted from the exhausting holes 58 on the opposite side of the opening 22. That is, the interior of the carrier 2 and the interior of the opening 22 are replaced with the inert gas. The timing for starting the supplement of the inert gas may be set freely between the timing for fixing the carrier 2 to the opening 22 and the timing for opening the lid 25 of the carrier 2.

The sensor for detecting oxygen density detects whether the interior of the carrier 2 is satisfactorily replaced with the inert gas. If the interior of the carrier 2 is satisfactorily replaced with the inert gas, the supplement of the inert gas comes to a stop. Then, as shown in FIG. 7c, the lid 25 is opened and retracted upward together with the door 23 to openly communicate the interior of the carrier 2 with the loading area S2. The semiconductor wafers W in the carrier 2 are then transferred into the wafer-boat 4 by the transferring mechanism 19. After the carrier 2 becomes empty, the door 23 and the lid 25 are closed. The empty carrier 2 on the stage 11 is replaced with another carrier 2 in the storing sections 10. The above operations are repeated until a prescribed number of, for example 100 to 150, semiconductor wafers W are transferred into the wafer-boat 4.

Then, the wafer-boat 4 including the prescribed number of the semiconductor wafers W is loaded into the thermal processing furnace 5. The semiconductor wafers W undergo the prescribed heat process. After the heat process has finished, the wafer-boat 4 is unloaded from the thermal processing furnace 5. The processed semiconductor wafers W in the wafer-boat 4 are transferred into the empty carrier 2 in the reverse order of the above operations.

As described above, when the carrier 2 abuts on the opening 22 on the atmospheric side, the door 23 closing the opening 22 and the lid 25 are opened not at the same time but only the lid 25 is opened while the door 23 remains closed, the interior of the carrier 2 is replaced with the inert gas, and then the door 23 is opened to openly communicate the interior of the carrier 2 with the loading area S2. Thus, it can be prevented that the air leaks from the atmospheric operation area S1 or from the interior of the carrier 2 into the loading area S2. Therefore, the replacement of the loading area S2 with the inert gas needs less time, and the forming of the natural oxidation film on the semiconductor wafers W is prevented so that the process has no adverse effect. That is, this unit can perform the process of the semiconductor wafers W without increasing the concentration of the oxygen by the air in the carrier 2, so that the throughput and the yield are improved.

This invention is not limited by the above embodiment and may be modified variously within the scope of claim.

Figure 10:
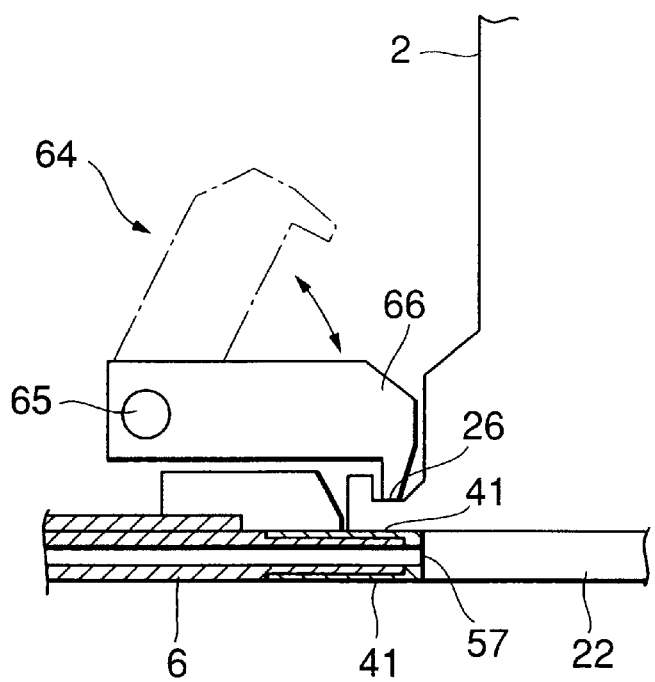
FIG. 10 is an explanatory view of another example of the fixing means for fixing the carrier to the opening in the partition.
Figure 11:
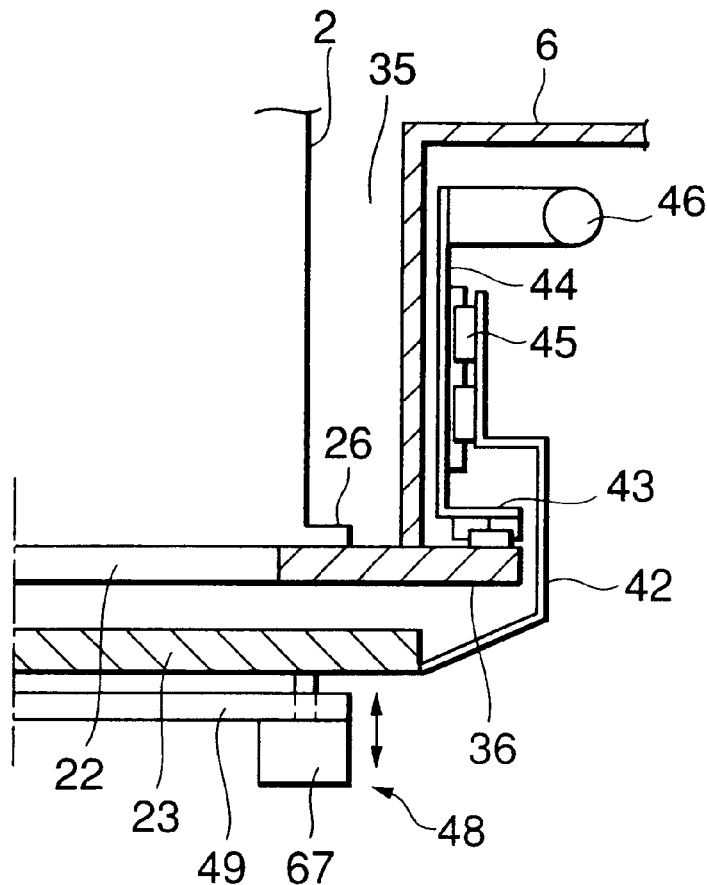
FIG. 11 is an explanatory view of another lid opening-closing mechanism.

For example, as shown in FIG. 10, the carrier fixing means may comprise a carrier lock mechanism 64. The carrier lock mechanism 64 has a lock arm 66 supported rotatably by a shaft 65, adjacent to the opening 22 in the partition 6. The lock arm 66 is adapted to be rotated to press and fix the flange 26 of the carrier 2. Additionally, as shown in FIG. 11, the lid opening-closing mechanism 48 may comprise a front-rear movable frame 49 without supporting arms 50 for simplification of the structure and space-saving. The front-rear movable frame 49 is movable in a front-rear direction in front of the door 23 via air cylinders 67.

What is claimed is:

1. A processing unit for a substrate, comprising:
   a partition, dividing an atmospheric area from an inert gas area, which inert gas area is an enclosed area;
   a first partition opening and a second partition opening, defined by the partition, the first and second partition openings each communicating the atmospheric area with the inert gas area;
   a first door provided at the first partition opening, and a second door provided at the second partition opening, the first and second doors provided to open and to close the first and second partition openings, respectively;
   a first carrier and a second carrier for a substrate, each of the first and second carriers having a carrier opening formed in a side of the carrier, and each of which carriers including a lid to open and to close the carrier opening;
   first carrier positioning means and second carrier positioning means, each of which carrier positioning means being provided for positioning the first and the second carrier, respectively, adjacent the first and second partition openings, on an atmospheric side of the partition openings, to sealingly contact each of the carriers with the respective partition opening, to communicate each of the carrier openings with the corresponding partition opening;
   a lid opening-closing mechanism mounted on each of the first and second doors of the partition openings, which lid opening-closing mechanism holds the lid of the respective carrier, and opens and closes the lid;
   a first door opening-closing mechanism and a second door opening-closing mechanism, each mounted on the partition for opening and closing the first and the second door, respectively, such that each of the door opening-closing mechanisms opens the respective door with the lid opening-closing mechanism holding the lid of the respective carrier, with the respective carrier in sealing contact with the corresponding partition opening; and
   inert gas replacing means for replacing gas in each of the carriers with an inert gas by introducing the inert gas into each of the carriers with the carrier in sealing contact with the corresponding partition opening, with the corresponding door closing the respective partition openings, and with the corresponding lid opened by the corresponding lid opening-closing mechanism.

2. The processing unit according to claim 1, wherein the inert gas replacing means comprise an inert gas supplying hole and a gas exhausting hole which communicate with each opening carrier with the door closed and the lid open.

3. The processing unit according to claim 1, wherein each of the carriers and the corresponding openings in the partition sealingly contact one another via a sealing element.

4. The processing unit according to claim 1, wherein the first door moves downward to open the first opening, and wherein the second door moves upward to open tie second opening.

5. The processing unit according to claim 1,
   wherein each of the carrier lids defines at least two key-holes;
   wherein each of the lid opening-closing mechanisms comprises a key-handling mechanism, which key-handling mechanism comprises:
      a handling member, shiftable in a lateral direction by handling member shifting means,
      a first rotating member and a second rotating member, attached by links at a first and a second end of the handling member, such that a linear lateral movement of the handling member is converted into a rotating movement of the first and second rotating members, and
      a first key and a second key, mounted on the first rotating member and the second rotating member, respectively, by means of rotating shafts, such that when the first and second keys are inserted in the key-holes of the lid, a lateral movement of the handling member causes the rotating members to rotate, thereby rotating the first and second keys to secure the lid to the carrier; and wherein the first key and the second key of each of the lid opening-closing mechanisms holds the respective lids of the first and second carriers with the lids not secured to the respective carriers.

6. A processing unit for a substrate, comprising:
   a partition dividing an atmospheric area from an inert gas area, which inert gas area is an enclosed area;
   first and second partition openings defined by the partition, the first and second partition openings communicating the atmospheric area with the inert gas area;
   a first door and a second door provided at the first and second partition openings, respectively, which doors open the corresponding partition openings in an open position and close the corresponding partition openings in a closed position;
   a first carrier and a second carrier for a substrate, the first and second carriers each having a carrier opening formed in a side of the respective carriers, which carriers each include a lid to open and to close the respective carrier openings, each of which lids opens the corresponding carrier in an open position and closes the corresponding carrier in a closed position;
   a first and second carrier positioning means for positioning the first and second carriers, respectively, adjacent the corresponding partition openings, on an atmospheric side of the partition openings, to sealingly contact each of the carriers with the corresponding partition opening to communicate each of the carrier openings with the corresponding partition opening;
   a lid opening-closing mechanism mounted on each of the doors of the respective partition openings, each of which lid opening-closing mechanisms holds the lid of the respective carrier in the open position and in the closed position, to open and to close the respective lids;
   a first door opening-closing mechanism and a second door opening-closing mechanism, mounted on the partition to move the first and the second doors, respectively, from the closed position to the open position, to close and to open the respective door, such that the door opening-closing mechanism opens the door with the lid opening-closing mechanism holding the lid of the carrier, and with the respective carrier in sealing contact with the corresponding partition opening; and
   inert gas replacing means for replacing gas in each of the carriers with an inert gas by introducing the inert gas into each of the carriers with the carrier in sealing contact with the corresponding partition opening, with the corresponding door in the closed position, and with the corresponding lid in the open position.

7. The processing unit according to claim 6, wherein the inert gas replacing means comprises an inert gas supplying hole and a gas exhausting hole which communicate with each carrier opening with the corresponding door in the closed position and the corresponding lid in the open position.

8. The processing unit according to claim 6, wherein the carrier and the opening in the partition sealingly contact each other via a sealing element.

9. The processing unit according to claim 6, wherein the first door moves downward to open the first partition opening, and wherein the second door moves upward to open the second partition opening.

10. A method for processing a substrate using the processing unit according to claim 6, the method comprising:

moving the first door downward to close the first door, thereby closing the first partition opening;

positioning the first carrier adjacent the first partition opening, on the atmospheric side of the first partition opening, such that the first carrier comes in sealing contact with the first partition opening, and such that the carrier opening of the first carrier is in communication with the first partition opening;

opening the lid of the first carrier while keeping the door of the first partition opening closed;

replacing gas in the first carrier with inert gas by the inert gas replacing means; and opening the first door to communicate the interior of the first carrier with the inert gas area via the first partition opening.

11. The processing unit according to claim 6, wherein each of the carrier lids defines at least two key-holes;

wherein each of the lid opening-closing mechanisms comprises a key-handling mechanism, which key-handling mechanism comprises:

a handling member, shiftable in a lateral direction by handling member shifting means, a first rotating member and a second rotating member, attached by links at a first and a second end of the handling member, such that a linear lateral movement of the handling member is converted into a rotating movement of the first and second rotating members, and a first key and a second key, mounted on the first rotating member and the second rotating member, respectively, by means of rotating shafts, such that when the first and second keys are inserted in the key-holes of the lid, a lateral movement of the handling member causes the rotating members to rotate, thereby rotating the first and second keys to secure the lid to the carrier; and wherein the first key and the second key of each of the lid opening-closing mechanisms holds the corresponding lid, with the lid not secured to the carrier.

* * * * *